US011955415B2

(12) United States Patent
Scharf et al.

(10) Patent No.: US 11,955,415 B2
(45) Date of Patent: Apr. 9, 2024

(54) SEMICONDUCTOR DEVICE PACKAGE COMPRISING A PIN IN THE FORM OF A DRILLING SCREW

(71) Applicant: Infineon Technologies Austria AG, Villach (AT)

(72) Inventors: Thorsten Scharf, Lappersdorf (DE); Thomas Bemmerl, Schwandorf (DE); Martin Gruber, Schwandorf (DE); Thorsten Meyer, Regensburg (DE); Frank Singer, Regenstauf (DE)

(73) Assignee: Infineon Technologies Austria AG, Villach (AT)

( * ) Notice: Subject to any disclaimer, the term of this patent is extended or adjusted under 35 U.S.C. 154(b) by 102 days.

(21) Appl. No.: 17/359,824

(22) Filed: Jun. 28, 2021

(65) Prior Publication Data
US 2022/0005755 A1 Jan. 6, 2022

(30) Foreign Application Priority Data
Jul. 3, 2020 (EP) .................................... 20183913

(51) Int. Cl.
*H01L 21/56* (2006.01)
*H01L 23/00* (2006.01)
*H01L 23/31* (2006.01)
*H01L 23/498* (2006.01)
*H01L 25/07* (2006.01)

(52) U.S. Cl.
CPC ........ *H01L 23/49811* (2013.01); *H01L 21/56* (2013.01); *H01L 23/3121* (2013.01); *H01L 23/49844* (2013.01); *H01L 24/48* (2013.01); *H01L 25/072* (2013.01);
(Continued)

(58) Field of Classification Search
CPC .............. H01L 23/49811; H01L 21/56; H01L 23/3121; H01L 23/49844; H01L 24/48; H01L 25/072; H01L 2224/48229; H01L 2224/48249; H01L 2924/18301; H01L 23/3107; H01L 23/3735; H01L 2224/0603; H01L 2224/48227; H01L 2224/48472; H01L 2224/4903; H01L 2224/49111; H01L 2924/181; H01L 25/16; H01L 25/18; H01L 25/50; H01L 21/4853; H01L 24/71; H01L 24/90
See application file for complete search history.

(56) References Cited

U.S. PATENT DOCUMENTS

2009/0146272 A1   6/2009  Wieneke et al.
2010/0117216 A1   5/2010  Lu et al.
(Continued)

FOREIGN PATENT DOCUMENTS

DE    102008033739 A1    1/2010
DE    102016124172 A1    6/2018
DE    102018114691 A1   12/2019

*Primary Examiner* — Elias Ullah
(74) *Attorney, Agent, or Firm* — Murphy, Bilak & Homiller, PLLC

(57) ABSTRACT

The semiconductor device package comprises a die carrier, at least one semiconductor die disposed on the carrier, the semiconductor die comprising at least one contact pad on a main face remote from the carrier, an encapsulant disposed above the semiconductor die, an electrical connector electrically connected with the contact pad, a drilling screw screwed through the encapsulant and connected with the electrical connector.

10 Claims, 9 Drawing Sheets

(52) U.S. Cl.
CPC .............. *H01L 2224/48229* (2013.01); *H01L 2224/48249* (2013.01); *H01L 2924/18301* (2013.01)

(56) References Cited

U.S. PATENT DOCUMENTS

| | | |
|---|---|---|
| 2010/0127383 A1 | 5/2010 | Oka et al. |
| 2011/0133320 A1* | 6/2011 | Inokuchi ................. H01L 24/49 438/118 |
| 2013/0082387 A1 | 4/2013 | Stolze et al. |
| 2015/0282350 A1 | 10/2015 | McBroom et al. |
| 2016/0240452 A1* | 8/2016 | Prajuckamol ......... H01L 23/049 |
| 2018/0147758 A1 | 5/2018 | Yasui et al. |

\* cited by examiner

SEMICONDUCTOR DEVICE PACKAGE COMPRISING A PIN IN THE FORM OF A DRILLING SCREW

RELATED APPLICATIONS

The instant application claims priority to EP Patent application EP20183913 filed on Jul. 3, 2020, the content of which is incorporated by reference herein in its entirety.

TECHNICAL FIELD

The present disclosure relates to a semiconductor device package and to a method for fabricating a semiconductor device package.

BACKGROUND

In many electronic systems it is necessary to employ converters like DC/DC converters, AC/DC converters, or DC/AC converters in order to generate the currents, voltages and/or frequencies to be used by an electronic circuit, like, for example, a motor driving circuit. The converter circuits as mentioned before typically comprise one or more half-bridge circuits, each provided by two semiconductor power switches, such as e.g. power MOSFET devices, and further components such as diodes connected in parallel to the transistor devices, and passive components such as an inductance and a capacitance. The switching of the power MOSFET devices can be controlled by a semiconductor control chip. The several components of the converter circuit may in principle be provided as individual components which are mounted on a printed circuit board. Alternatively, a part of or all of the components may be accommodated in a single semiconductor device package to form a multi-chip module, which may have an advantage that the assembly of the entire converter circuit on the board is simplified and the space required on the board can be reduced.

With these types of semiconductor device packages there is, however, a steady challenge concerning the forming of external contacts and connecting them with the contact pads of the semiconductor dies. The semiconductor device packages usually need a vertical wiring of electric contact, namely from the layer where the semiconductor dies are assembled upwards. As an example a specific package might be taken in which the substrate is a direct copper bond (DCB) and the vertical interconnects are formed by soldered sleeves with pressed-in pins. The assembly is later protected by a soft silicone cast. This soft cast has severe disadvantages compared to a hard molding compound as it is less protective against external ions, less stiff against mechanical force, and expensive. If a standard mold compound could be used, the external frame could be saved and its function taken by the mold itself. Additionally a high performance IMS (insulated metal substrate) could substitute the DCB as the mechanical stiffness is also covered by the mold. Anyhow, the wished flexibility for the pin positions makes a molding of this kind of assembly very difficult.

For these and other reasons there is a need for the present disclosure.

SUMMARY

A first aspect of the present disclosure is related to a semiconductor device package, comprising a die carrier, at least one semiconductor die disposed on the die carrier, an encapsulant disposed above the semiconductor die, an electrical connector electrically connected with either the contact pad of the semiconductor die or with another electrical device, and a metallic drilling screw screwed through the encapsulant and connected with the electrical connector.

A second aspect of the present disclosure is related to a method for fabricating a semiconductor device package, comprising providing a die carrier, disposing at least one semiconductor die onto the die carrier, electrically connecting the semiconductor die or another electrical device with an electrical connector, applying an encapsulation layer above the semiconductor die, the die carrier, and the electrical connector, and screwing a metallic drilling screw through the encapsulant so that an end of the drilling screw makes contact with the electrical connector.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

FIG. 2 comprises FIGS. 2A and 2B and shows perspective top views on a complete semiconductor device package according to the example of FIG. 1 wherein

DETAILED DESCRIPTION

Figure 1:
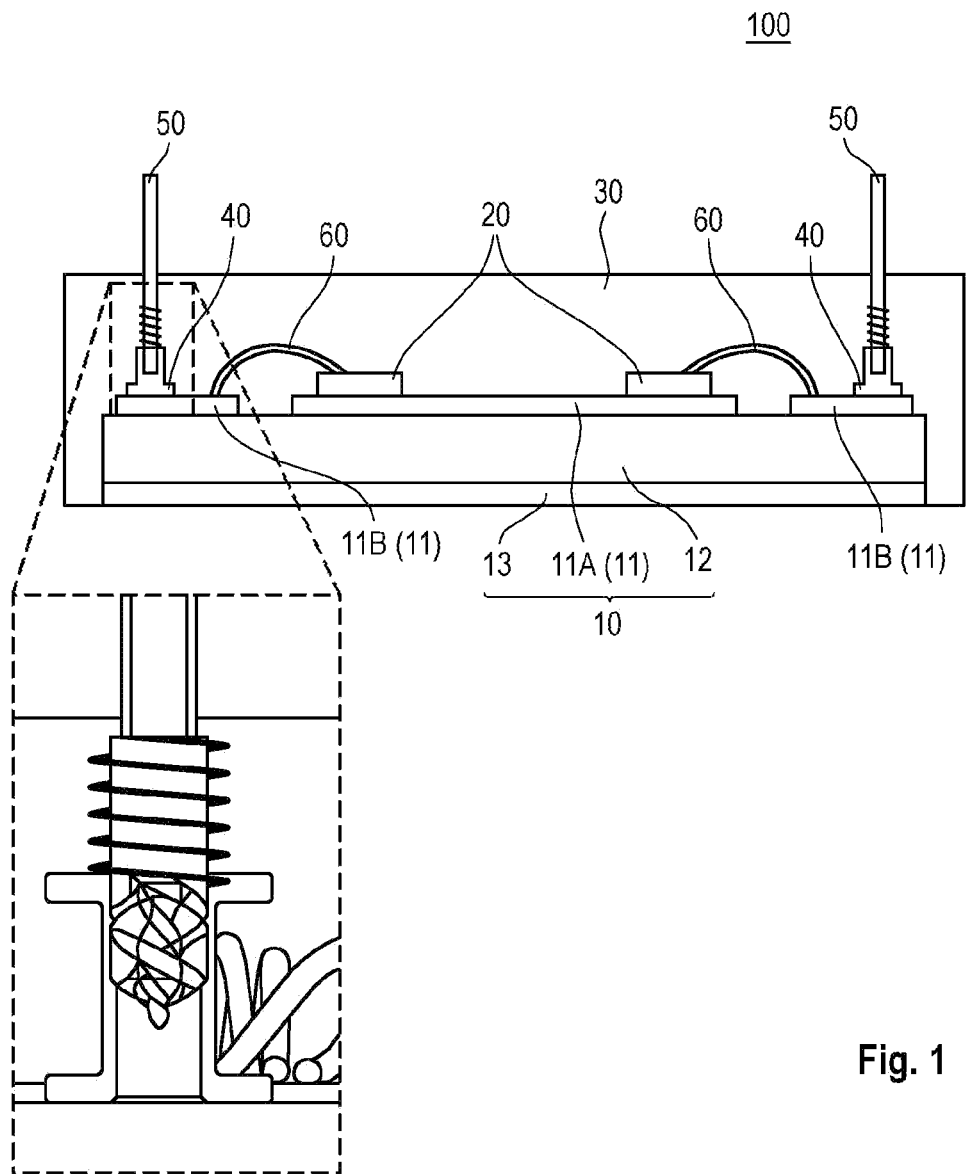
FIG. 1 shows a schematic cross-sectional side view representation of a semiconductor device package of the first aspect according to an example, in which the electrical connector is formed by a sleeve, wherein the enlarged section shows the connection between the screw and the electrical connector in further detail.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present disclosure is defined by the appended claims.

The embodiments of a semiconductor module and a method for fabricating a semiconductor module may use various types of transistor devices. The embodiments may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The embodiments may also use horizontal or vertical transistor devices wherein those structures may be provided in a form in which all contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures) like, for example, MOS transistor structures or IGBT (Insulated Gate Bipolar Transistor) structures.

In any case the semiconductor dies or semiconductor chips may comprise contact elements or contact pads on one or more of their outer surfaces wherein the contact elements serve for electrically contacting the semiconductor dies. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, or an electrically conducting organic material, or an electrically conducting semiconductor material. The contact elements may also be formed as layer stacks of one or more of the above-mentioned materials.

The embodiments of a semiconductor device package may comprise an encapsulant or encapsulating material having the semiconductor dies or transistor devices embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example.

FIG. 1 shows a cross-sectional side view representation of a semiconductor device package according to an example.

The semiconductor device package 100 of FIG. 1 comprises a direct copper bonded substrate (DCB) 10 comprising as usual a ceramic layer 12, which is covered by a first upper metallization layer 11, and a second lower metallization layer 13. The first metallization layer 11 may comprise one or more first metallization regions 11A (die carriers) on which one or more semiconductor dies 20 can be disposed. The present example shows one metallization region 11A on which two semiconductor dies 20 are disposed. The semiconductor dies 20 can be, for example, semiconductor transistor dies like IGBT dies or one semiconductor die 20 can be a semiconductor transistor die and the other one can be a semiconductor diode die. In general, each one of the semiconductor transistor dies may be constructed in a way that a first, lower main face comprises a first contact pad, in particular a drain contact pad, and a second upper main face comprises a second contact pad, in particular a source contact pad, and a third contact pad, in particular a gate contact pad. The semiconductor diode dies can also comprise a vertical structure having a first contact pad on a first, lower main face and a second contact pad on a second upper main face thereof. The semiconductor transistor dies and the semiconductor diode dies can be applied onto the first metallization region 11A by use of silver paste, solder or sinter paste for example. The two semiconductor dies 20 can be connected with each other which is not shown here for reasons of simplicity. The semiconductor dies 20 may each comprise at least one electrical contact pad on a main face remote from the substrate 10.

Furthermore an encapsulant 30 is disposed above the semiconductor dies 20 such that it covers the semiconductor dies 20 and an upper main face and side faces of the DCB 10.

The first metallization layer 11 may further comprise one or more second metallization regions 11B which may function as intermediate electrical connectors. The metallization region 11B may be connected to a contact pad of the semiconductor die 20 by means of a bond wire 60. Furthermore a metallic sleeve 40 (electrical connector) can be disposed on the metallization region 11B, the metallic sleeve 40 being dimensioned so as to receive a drilling screw 50.

As can be seen in the enlarged section of FIG. 1, the drilling screw 50 may comprise a drilling end section 51, a screw section 52 adjacent to the drilling end section 51, and a rod-shaped section 53 adjacent to the screw section 52. The drilling screw 50 is drilled and screwed through the encapsulant 30 until the drilling end section 51 reaches the metallic sleeve 40. The drilling end section 51 can then further be drilled into the metallic sleeve 40. The dimensions of the length of the screw section 52 and the thickness of the encapsulant 30 can be so that the screw section 52 is completely screwed into the encapsulant 30. Alternatively, it is also possible that the screw section is not completely screwed into the encapsulant and a portion of the screw section stands over the upper surface of the encapsulant 30.

It can further be seen in the enlarged section of FIG. 1, that the metallic sleeve 40 comprises an inner cavity 41 which comprises an open upper end into which the drilling screw 50 is drilled in. The lateral diameter of the drilling section 51 is slightly larger than the lateral diameter of the inner cavity of the metallic sleeve 40.

It should be added that FIG. 1 shows two semiconductor dies 20 which can be connected to respective electrical connectors 40 and drilling screws 50 in one and the same manner as was described above. However, it can also be the case that one of the semiconductor dies 20 is connected in a different way to an external connector wherein, for example, the external connector is given by a metallic sleeve into which a press pin is inserted.

According to FIG. 1 the drilling screws 50 are screwed into the encapsulant 30 through the upper main face thereof. However, it should be added that the drilling screws can also be screwed into the encapsulant through any other outer wall of the encapsulant as, for example, through one or more of the side walls of the encapsulant.

Figure 2A:
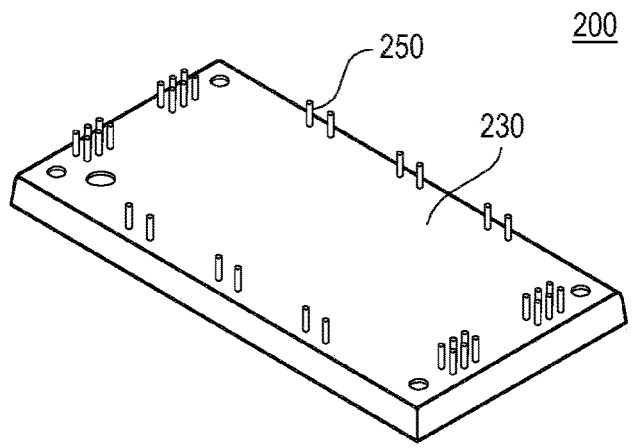
FIG. 2A shows the finished package and FIG. 2B shows the package where part of the encapsulant is broken off to show the inside of the package.
Figure 2B:
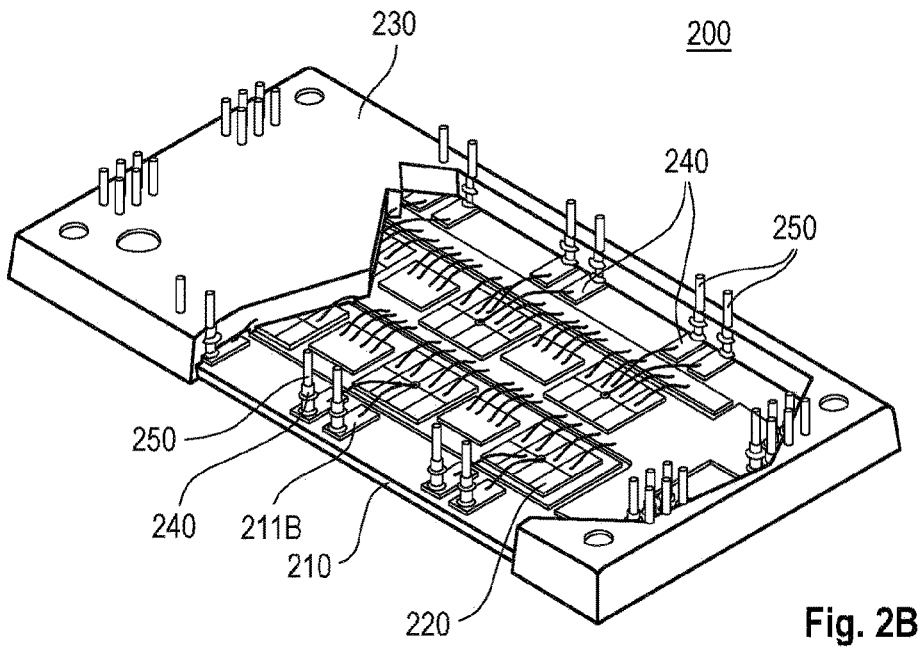

FIG. 2 comprises FIGS. 2A and 2B and shows perspective top views on an example of a complete semiconductor device package.

FIG. 2B shows an example of a semiconductor device package 200 which comprises a DCB 210 and a plurality of semiconductor dies 220 disposed on a first upper metallic layer of the DCB 210. The semiconductor dies 220 can be semiconductor transistor dies like, for example, IGBTs, and semiconductor diode dies. It can be seen that several ones of the semiconductor dies 220 are connected by bond wires with respective metallization regions 211B of the DCB 210. These metallization regions 211B are electrically connected with respective sleeves 240 which are disposed on an upper main face of the metallization regions 211B, respectively. Furthermore drilling screws 250 are screwed through the encapsulant 230 and drilled into an upper portion of the sleeves 240, respectively.

Figure 3:
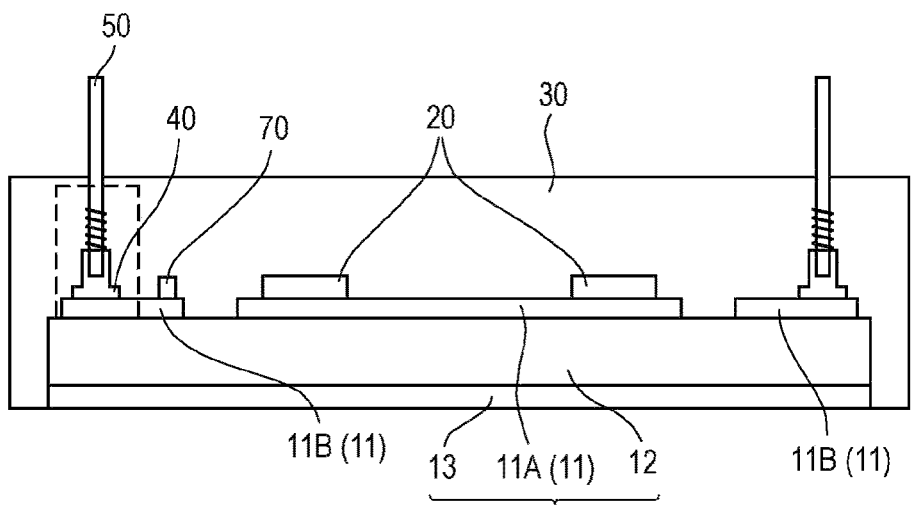
FIG. 3 shows a schematic cross-sectional side view representation of a semiconductor device package of the first aspect according to an example, in which the electrical connector is not connected with the semiconductor die but with another electrical device.

FIG. 3 shows a cross-sectional side view representation of a semiconductor device package according to another example. The semiconductor device package 300 of FIG. 3 is similar to the semiconductor device package 100 of FIG. 1 so that in the following only the differences with be explained. With the semiconductor device package 100 of FIG. 1 one or both of the depicted semiconductor dies 10 were connected to the electrical connector 40. In the semiconductor device package 300 of FIG. 3 the semiconductor dies 20 are not connected to the electrical connector 40. Instead another electrical device 70 like, for example, a temperature sensor 70 is disposed on the second metallization region 11B and thereby electrically connected to the electrical connector 40. The semiconductor dies 20 can be connected to another type of external connector which is not shown here for reasons of simplicity.

The example of a semiconductor device package 300 as shown in FIG. 3 serves the purpose to make clear that the one or more semiconductor dies 20 present in the semiconductor device package 300 do not have to be electrically connected to drilling screws as was shown and explained in connection with FIG. 1. It should be added, however, that this does not mean that the semiconductor dies 20 have to be connected with other types of external connectors. At least some of them can as well be connected to electrical connectors 40 and drilling screws 50 as shown in the example of a semiconductor device package 100 of FIG. 1.

FIG. 4 comprises FIG. 4A to 4H and shows perspective views of different examples of drilling screws.

As will be seen in the examples, the drilling screw further comprises a driver section, which is either located at an end of the rod-shaped section 53 or integrated in an end of the rod-shaped section 53.

Figure 4A:
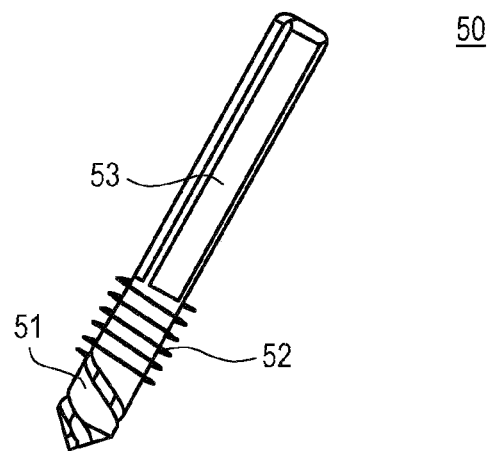
FIG. 4 comprises FIG. 4A to 4H and shows perspective views of different examples of drilling screws.

FIG. 4A shows an example of a drilling screw which was used in the example of semiconductor device package as shown and described in connection with FIG. 1. This kind of drilling screw 50 comprises a drilling section 51, a screw section 52, and a rod-shaped section 53. Furthermore this kind of drilling screw 50 has a square profile over its full length so that an upper end section of the rod-shaped section 53 may serve as a driver section where a square spanner can engage to screw the drilling screw 50 into the encapsulant.

Figure 4B:
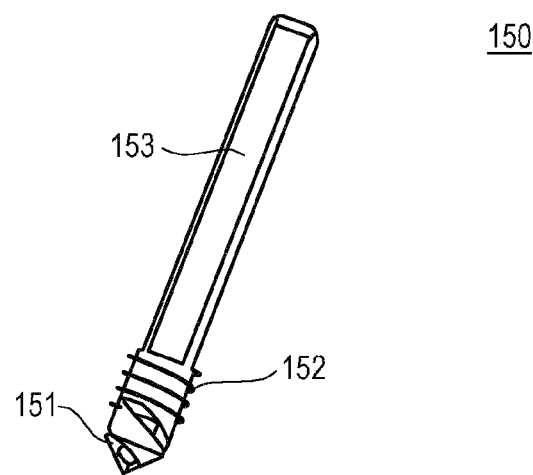
Figure 4C:
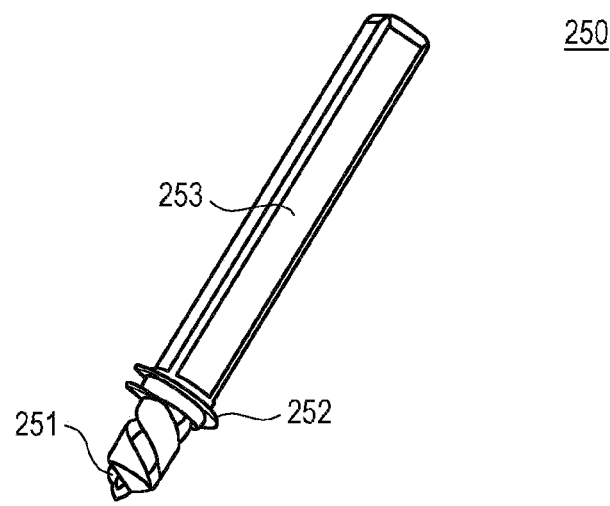

FIGS. 4B and 4C show further examples of drilling screws similar to the example of FIG. 4A. The drilling screws 150 and 250 as shown in FIGS. 4B and 4C only differ from the drilling screw 50 of FIG. 4A in that the lengths of the rod-shaped sections 153, 253 are extended at the expense of the length of the screw sections 152, 252 and the drilling sections 151, 251. In the drilling screw 150 of FIG. 4B the lengths of both the screw section 152 and the drilling end section 151 are shortened to about a half of their lengths in the drilling screw of FIG. 4A. In the drilling screw 250 of FIG. 4C the drilling section 251 has about the same length as the drilling section 51 of the drilling screw 50, but a reduced diameter, whereas the screw section 252 is shortened so that it has only about one winding. The rod-shaped sections 153, 253 comprise square profiles as in the drilling screw 50 of FIG. 4A.

Figure 4D:
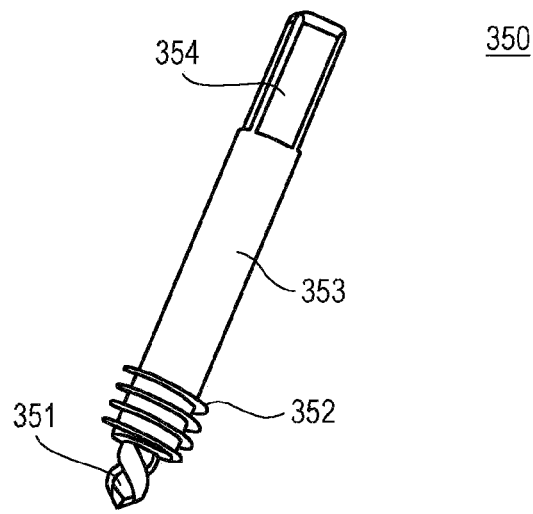

FIG. 4D shows a further example of a drilling screw 350 which comprises a drilling section 351, a screw section 352, a rod-shaped section 353, and a driver section 354. That means, in this example of a drilling screw 350, there the rod-shaped section 353 and the driver section 354 are clearly distinguished from each other. The driver section 354 comprises again a square profile.

Figure 4E:
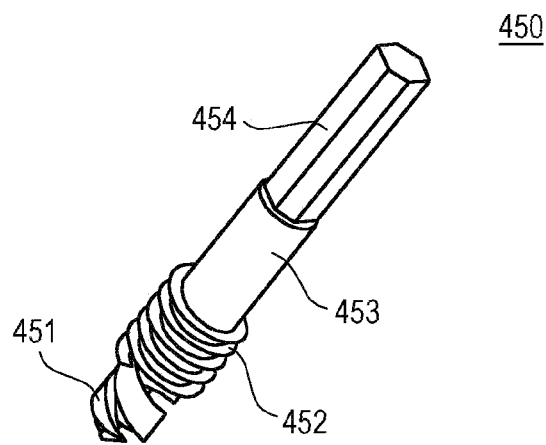

FIG. 4E shows a further example of a drilling screw 450 which comprises a drilling section 451, a screw section 452, a rod-shaped section 453, and a driver section 454. Similar to the drilling screw 350 from FIG. 4D, in this example of a drilling screw 450, there the rod-shaped section 453 and the driver section 454 are clearly distinguished from each other. The driver section 454 comprises again a square profile.

Figure 4F:
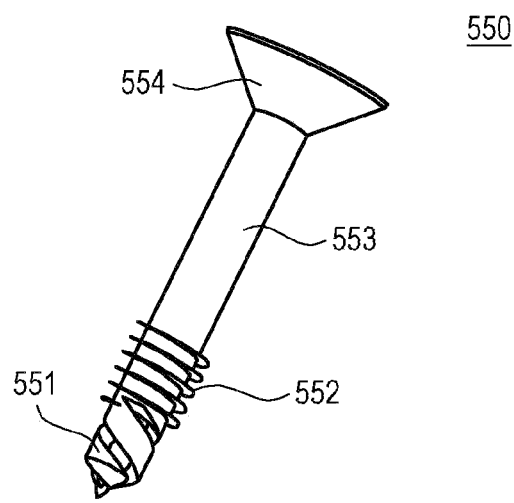
Figure 4G:
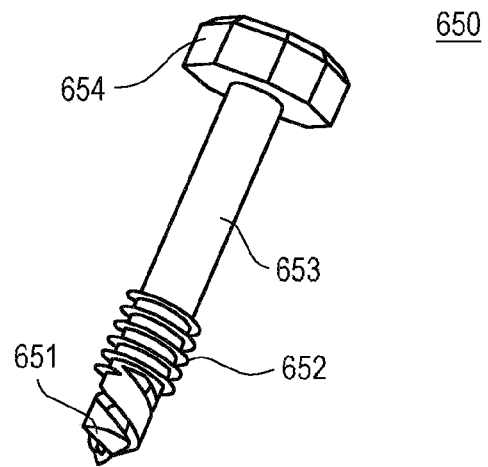
Figure 4H:
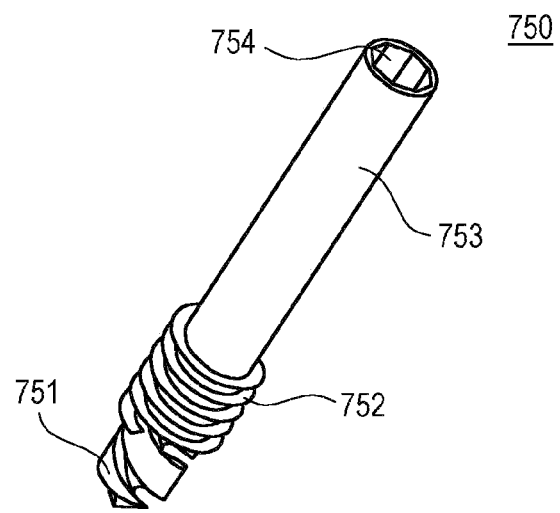
Figure 4A:
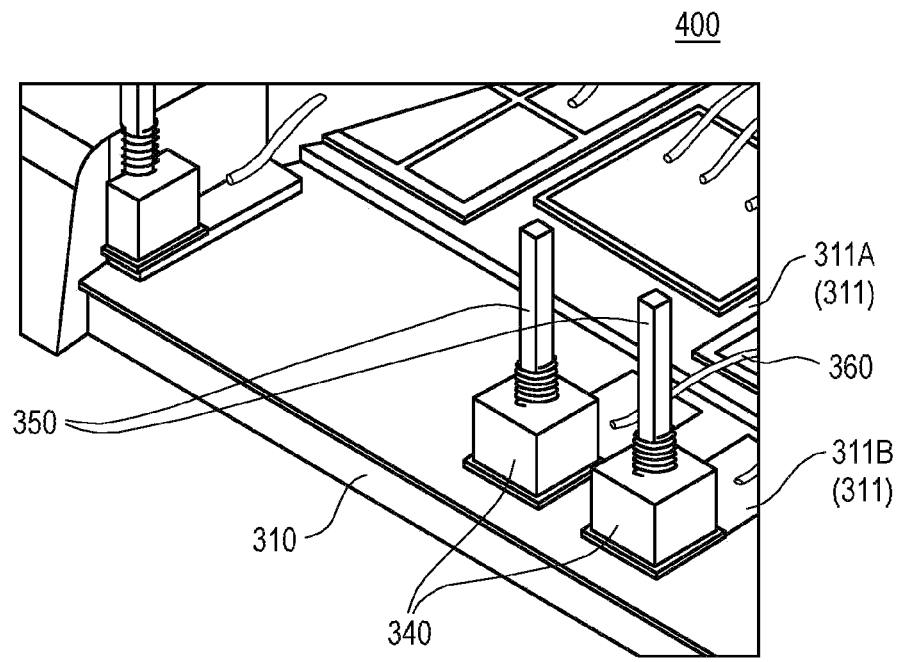
Figure 4B:
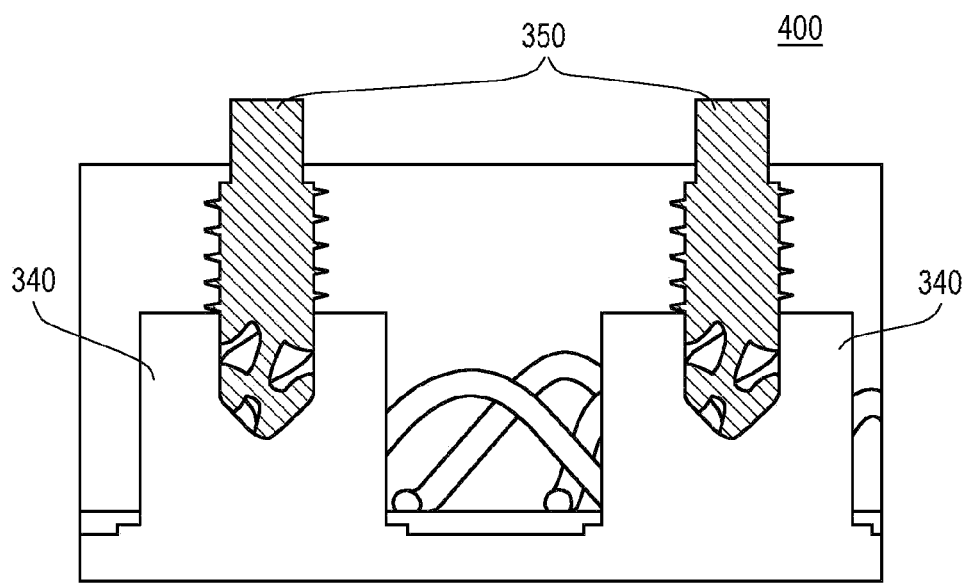

FIGS. 4F to 4H show further examples of drilling screws which comprise driver sections which are different from the driver sections of the previously shown drilling screws.

FIG. 4F shows an example of a drilling screw 550 which is formed after a conventional countersunk screw. Accordingly the drilling screw 550 comprises a drill section 551 and screw section 552 similar to the drill section 51 and the screw section 52 of the drilling screw 50, a rod-shaped section 553 similar to the rod-shaped section 353 of the drilling screw 350, and a driver section 554 which is formed like a cone head of a conventional countersunk screw. On the upper surface of the cone head there can be any provided a hexagon socket or cross recess or any other type of socket or recess which a conventional spanner or wrench can engage with.

FIG. 4G shows an example of a drilling screw 650 which comprises a drill section 651 and screw section 652 similar to the drill section 51 and the screw section 52 of the drilling screw 50, a rod-shaped section 653 again similar to the rod-shaped section 353 of the drilling screw 350, and a driver section 654 which is formed like an octagonal screw head which can be driven by an appropriate conventional spanner or wrench. Of course, the driver section 654 can also be formed hexagonal.

FIG. 4H shows an example of a drilling screw 750 which comprises a drill section 751 and screw section 752 similar to the drill section 51 and the screw section 52 of the drilling screw 50, a rod-shaped section 753 again similar to the rod-shaped section 353 of the drilling screw 350, and a driver section 754 which is integrated into a cavity in an upper portion of the rod-shaped section 753. The cavity of the driver section 754 is formed like an internal octagon or octagonal socket which can be driven by an appropriate conventional spanner or wrench. Of course, also in this case the driver section 754 can also be formed hexagonal.

It should be added furthermore that the present disclosure is of course not restricted to the types of drilling screws as shown in FIG. 4A to 4H. Any other types of drilling screws can be employed instead.

Figure 5A:
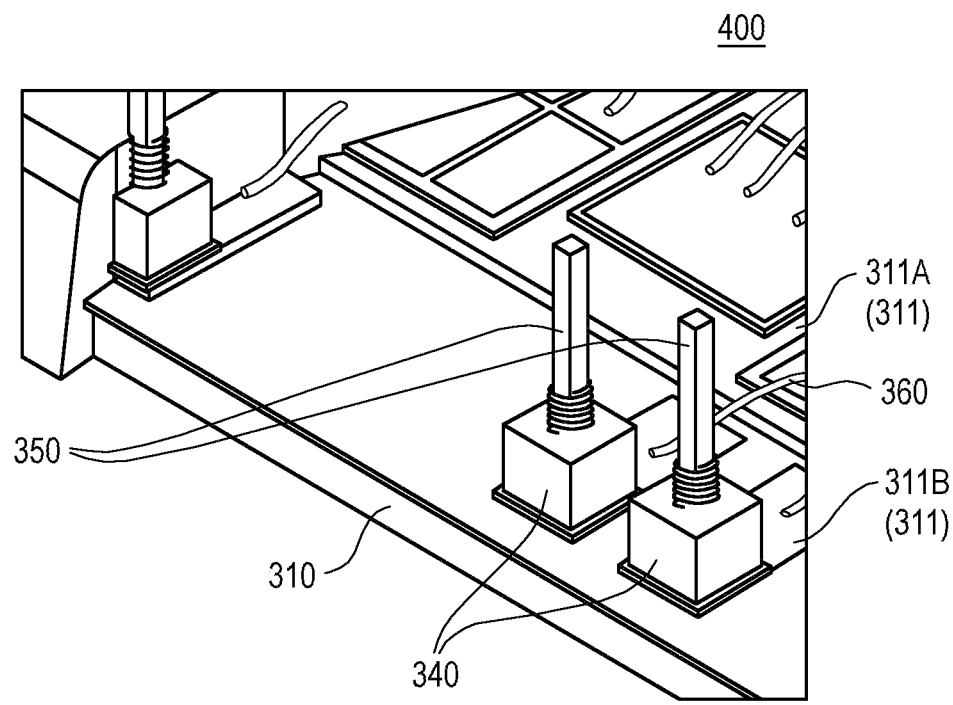
FIG. 5 comprises FIGS. 5A and 5B and shows respective portions of a further example of a semiconductor device package in a perspective top view (A) and in a cross-sectional side view through two adjacent electrical connectors (B).
Figure 5B:
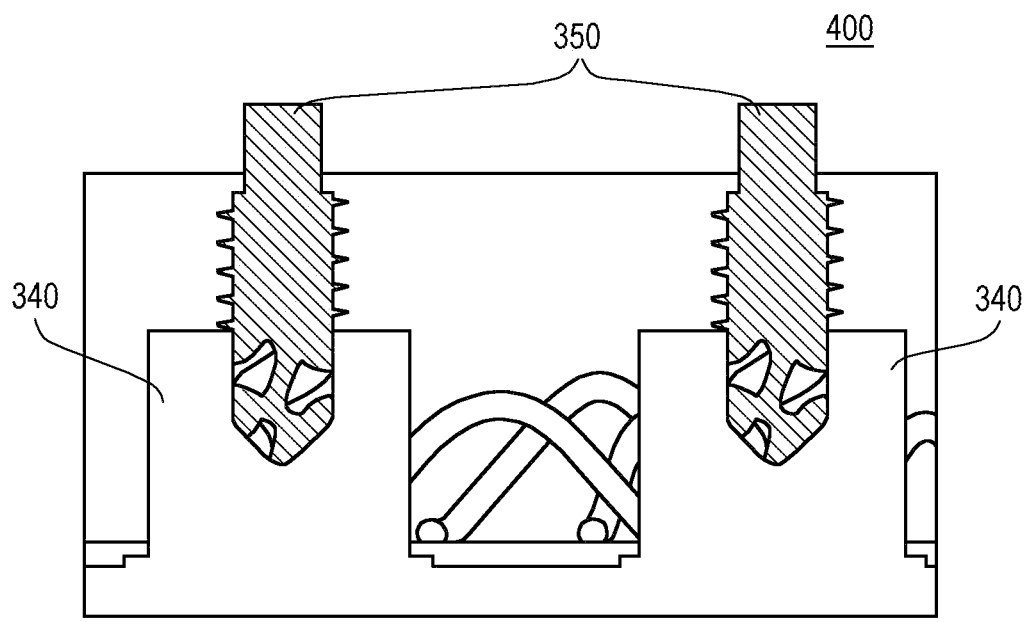

FIG. 5 comprises FIGS. 5A and 5B and shows a further example of a semiconductor device package in a perspective top view (A) and in a cross-sectional side view through two adjacent electrical connectors (B).

The semiconductor device package 400 of FIG. 5 comprises a structure which is similar to the structure of the semiconductor device package 100 of FIG. 1 so that in the following only the differences to the latter will be explained. The semiconductor device package 400 of FIG. 5 also comprises a DCB 310 comprising a first upper metallization layer 311 comprising first metallization regions 311B and second metallization regions 311B. A plurality of semiconductor dies 320 is disposed on the first metallization regions 311A and several ones of the semiconductor dies 320 are connected by bond wires 360 with respective second metallization regions 311B of the first metallization layer 311 of the DCB 310. These second metallization regions 311B are electrically connected with respective metal blocks 340 which are disposed on an upper main face of the second metallization regions 311B, respectively. Furthermore drilling screws 350 are screwed through the encapsulant 330 and drilled into an upper portion of the metallic blocks 340, respectively. The metallic blocks can, for example, be copper blocks.

Figure 6A:
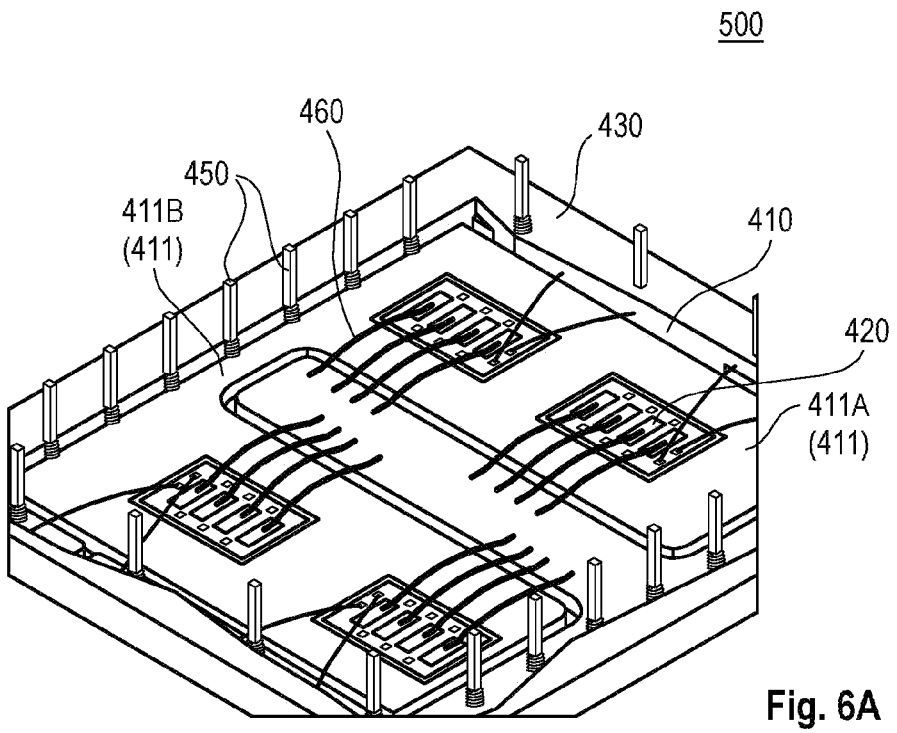
FIG. 6 comprises FIGS. 6A and 6B and shows a further example of a semiconductor device package in a perspective top view (A) and in a cross-sectional side view through an electrical connector.
Figure 6B:
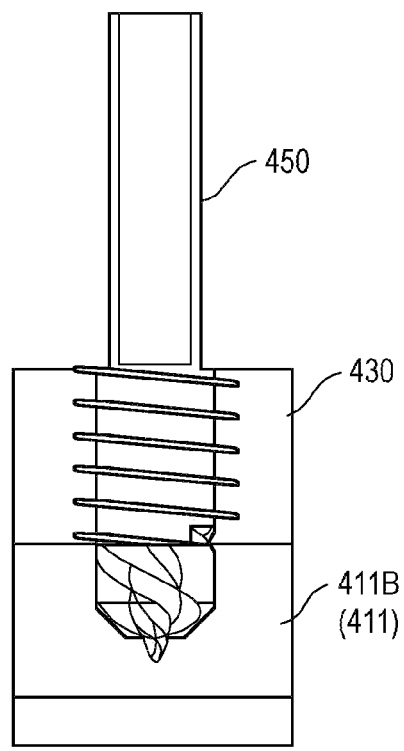

FIG. 6 comprises FIGS. 6A and 6B and shows a further example of a semiconductor device package in a perspective top view (A) and in a cross-sectional side view through an electrical connector.

The semiconductor device package 500 of FIG. 6 comprises a structure which is similar to the structure of the semiconductor device package 100 of FIG. 1 so that in the following only the differences to the latter will be explained. The semiconductor device package 500 of FIG. 6 also comprises a DCB 410 comprising a first upper metallization layer 411 comprising first metallization regions 411B and second metallization regions 411B. A plurality of semiconductor dies 420 is disposed on the first metallization regions 411A and several ones of the semiconductor dies 420 are connected by bond wires 460 with respective second metallization regions 411B of the first metallization layer 411 of the DCB 410. These second metallization regions 411B do not serve as intermediate electrical connectors, but are directly electrically connected by the drilling screws 450. More specifically, drilling screws 450 are screwed through the encapsulant 430 and drilled into an upper portion of the second metallization regions 411B themselves, respectively. It may be that for proper functioning in case of a DCB 410, the first upper metallization layer 411 may have to be formed somewhat or significantly thicker than usual.

Figure 7:
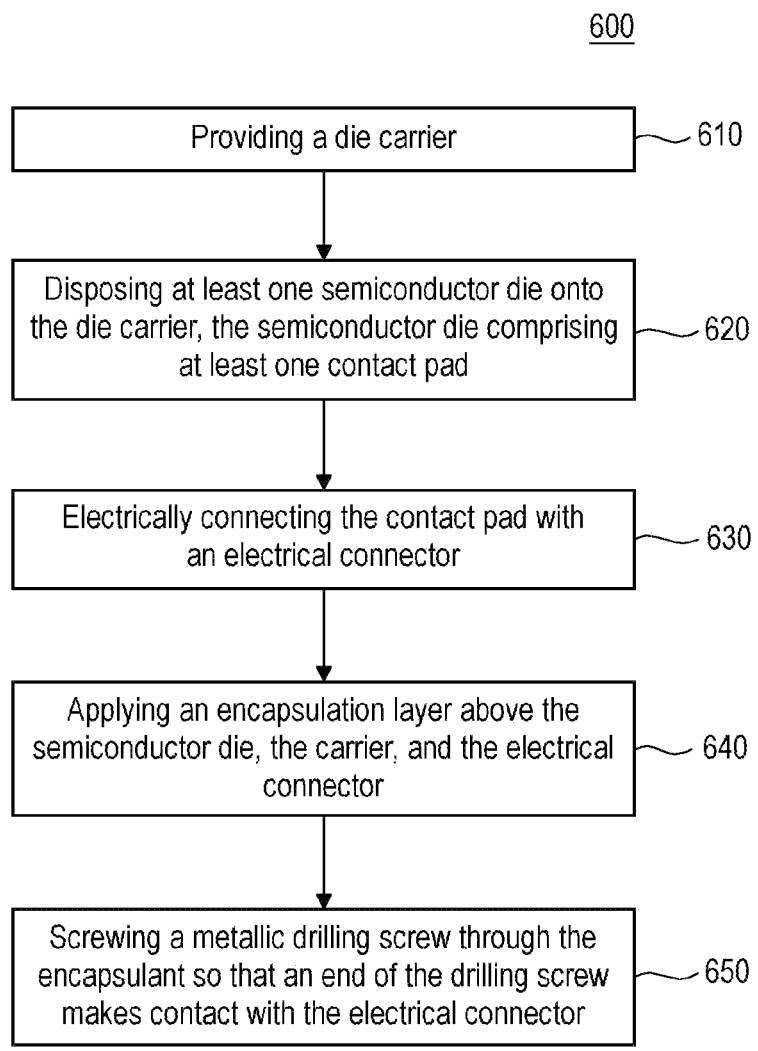
FIG. 7 shows a flow diagram of a method for fabricating a semiconductor device package according to the second aspect.

FIG. 7 shows a flow diagram of a method for fabricating a semiconductor device package according to the second aspect.

The method 600 of FIG. 7 comprises providing a die carrier (610), disposing at least one semiconductor die onto the die carrier, the semiconductor die comprising at least one contact pad (620), electrically connecting the contact pad with an electrical connector (630), applying an encapsulation layer above the semiconductor die, the carrier, and the electrical connector (640), and screwing a metallic drilling screw through the encapsulant so that an end of the drilling screw makes contact with the electrical connector (650).

According to an example of the method 500, providing the die carrier comprises providing one out of a group consisting of a leadframe, a direct copper bonded substrate, a direct aluminum bonded substrate, and an active metal brazing substrate, wherein the die carrier is part of the one.

According to an example of the method 500, the encapsulant comprises a first upper main face remote from the die carrier, and screwing the drilling screw is performed such that the drilling screw extends through the first main face of the encapsulant.

According to an example of the method 500, screwing the drilling screw comprises drilling the screw into the electrical connector.

Further examples of the method 500 can be construed by adding one or more of the features as were described above in connection with the semiconductor device package according to the first aspect.

Example 1 is a semiconductor device package, comprising a die carrier, at least one semiconductor die disposed on the die carrier, an encapsulant disposed above the semiconductor die, an electrical connector electrically connected with the semiconductor die or with another electrical device, and a metallic drilling screw screwed through the encapsulant and connected with the electrical connector.

Example 2 is a semiconductor device package according to Example 1, wherein the drilling screw is drilled into the electrical connector.

Example 3 is a semiconductor device package according to Example 1 or 2, wherein the drilling screw comprises a drilling end section, a screw section adjacent to the drilling end section, and a rod-shaped section adjacent to the screw section.

Example 4 is a semiconductor device package according to Example 3, wherein the drilling screw further comprises a driver section, which is either located at an end of the rod-shaped section or integrated in an end of the rod-shaped section.

Example 5 is a semiconductor device package according to any one of the preceding Examples, further comprising substrate, wherein the substrate comprises the carrier and is one out of a group consisting of a leadframe, a direct copper bonded substrate, a direct aluminum bonded substrate, and an active metal brazing substrate.

Example 6 is a semiconductor device package according to Example 5, wherein the substrate is one out of a group consisting of a direct copper bonded substrate, a direct aluminum bonded substrate, or an active metal brazing substrate, wherein the substrate comprises a ceramic layer, in particular one or more of AlO, AlN, $Al_2O_3$, or a dielectric layer, in particular $Si_3N_4$.

Example 7 is a semiconductor device package according to any one of the preceding Examples, wherein the encapsulant comprises a first upper main face remote from the die carrier, wherein the drilling screw extends through the first main face of the encapsulant.

Example 8 is a semiconductor device package according to any one of the preceding Examples, wherein the electrical connector is one out of a group consisting of
 a sleeve comprising an inner cavity,
 a metal block, and
 a metal layer of one of a direct copper bonded substrate, a direct aluminum bonded substrate, or an active metal brazing substrate.

Example 9 is a semiconductor device package according to any one of the preceding Examples, wherein the drilling screw is made by one of Cu, a Cu alloy, an Al alloy, or steel.

Example 10 is a semiconductor device package according to any one of the preceding Examples, comprising a plurality of semiconductor transistor dies disposed on the carrier, at least one of the semiconductor transistor dies comprising at least one contact pad on a main face remote from the die carrier;
 a plurality of semiconductor diode dies disposed on the die carrier, wherein at least one of the semiconductor diode dies is connected in parallel with one of the semiconductor transistor dies;
 a plurality of electrical connectors, wherein at least one of the electrical connectors is connected with one of the contact pads of the semiconductor transistor dies; and
 a plurality of metallic drilling screws, wherein at least one of the metallic drilling screws is screwed through the encapsulant and connected with the electrical connector.

Example 11 is an electronic device according to Example 10, wherein the load electrodes are separated by the electrically insulating material by a distance of smaller than 2.0 mm.

Example 12 is a method for fabricating a semiconductor device package, comprising providing a die carrier, disposing at least one semiconductor die onto the die carrier, electrically connecting the semiconductor die or another electrical device an electrical connector, applying an encapsulation layer above the semiconductor die, the die carrier, and the electrical connector, and screwing a metallic drilling screw through the encapsulant so that an end of the drilling screw makes contact with the electrical connector.

Example 13 is the method according to Example 12, wherein providing the die carrier comprises providing one out of a group consisting of a leadframe, a direct copper bonded substrate, a direct aluminum bonded substrate, and an active metal brazing substrate, wherein the die carrier is part of the one.

Example 14 is the method according to any one of Examples 11 to 13, wherein the encapsulant comprises a first upper main face remote from the die carrier, and screwing the drilling screw is performed such that the drilling screw extends through the first main face of the encapsulant.

Example 15 is the method according to any one of Examples 11 to 14, wherein screwing the drilling screw comprises drilling the screw into the electrical connector.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A semiconductor device package, comprising:
 a die carrier;
 at least one semiconductor die disposed on the die carrier;
 an encapsulant disposed above the semiconductor die;
 an electrical connector electrically connected with the semiconductor die or with another electrical device; and
 a metallic drilling screw screwed through the encapsulant and connected with the electrical connector, wherein an outer end of the metallic drilling screw extends through a first upper main face of the encapsulant opposite from the die carrier.

2. The semiconductor device package according to claim 1, wherein the drilling screw is drilled into the electrical connector.

3. The semiconductor device package according to claim 1, wherein the drilling screw comprises a drilling end section, a screw section adjacent to the drilling end section, and a rod-shaped section adjacent to the screw section.

4. The semiconductor device package according to claim 3, wherein
 the drilling screw further comprises a driver section, wherein the driver section is either located at an end of the rod-shaped section or integrated in the end of the rod-shaped section.

5. The semiconductor device package according to claim 1, further comprising
 a substrate, wherein the substrate comprises the carrier and is one out of a group consisting of a leadframe, a direct copper bonded substrate, a direct aluminum bonded substrate, and an active metal brazing substrate.

6. The semiconductor device package according to claim 5, wherein the substrate is one out of a group consisting of a direct copper bonded substrate, a direct aluminum bonded substrate, or an active metal brazing substrate, wherein the substrate comprises a ceramic layer, in particular one or more of AlO, AlN, $Al_2O_3$, or a dielectric layer, in particular $Si_3N_4$.

7. The semiconductor device package according to claim 1, wherein
the electrical connector is one out of a group consisting of:
a sleeve comprising an inner cavity,
a metal block, and
a metal layer of one of a direct copper bonded substrate, a direct aluminum bonded substrate, or an active metal brazing substrate.

8. The semiconductor device package according to claim 1, wherein the drilling screw is made by one of Cu, a Cu alloy, an Al alloy, or steel.

9. The semiconductor device package according to claim 1, further comprising
a plurality of semiconductor transistor dies disposed on the carrier, at least one of the semiconductor transistor dies comprising at least one contact pad;
a plurality of semiconductor diode dies disposed on the die carrier, wherein at least one of the semiconductor diode dies is connected in parallel with one of the semiconductor transistor dies;
a plurality of electrical connectors, wherein at least one of the electrical connectors is connected with one of the contact pads of the semiconductor transistor dies; and
a plurality of metallic drilling screws, wherein at least one of the metallic drilling screws is screwed through the encapsulant and connected with the electrical connector.

10. The semiconductor device package according to claim 9, wherein the semiconductor transistor dies and the semiconductor diode dies are interconnected to form an AC/AC converter circuit, an AC/DC converter circuit, a DC/AC converter circuit, a frequency converter or a DC/DC converter circuit.

* * * * *